(12) United States Patent
Linares

(10) Patent No.: US 8,133,320 B2
(45) Date of Patent: Mar. 13, 2012

(54) DIAMOND HEAT SINK IN A LASER

(75) Inventor: Robert Linares, Sherborn, MA (US)

(73) Assignee: Apollo Diamond, Inc., Framingham, MA (US)

( * ) Notice: Subject to any disclaimer, the term of this patent is extended or adjusted under 35 U.S.C. 154(b) by 237 days.

(21) Appl. No.: 10/925,217

(22) Filed: Aug. 24, 2004

(65) Prior Publication Data

US 2006/0045154 A1    Mar. 2, 2006

(51) Int. Cl.
*C30B 29/02* (2006.01)

(52) U.S. Cl. ............ 117/89; 117/94; 117/95; 423/446

(58) Field of Classification Search ............ 117/89, 117/94, 95; 423/446
See application file for complete search history.

(56) References Cited

U.S. PATENT DOCUMENTS

| | | | | |
|---|---|---|---|---|
| 4,092,614 | A * | 5/1978 | Sakuma et al. | 372/36 |
| 6,582,513 | B1 * | 6/2003 | Linares et al. | 117/93 |
| 6,954,034 | B2 * | 10/2005 | Morishita | 315/169.3 |
| 7,075,963 | B2 * | 7/2006 | Basting et al. | 372/55 |
| 2001/0001385 | A1 * | 5/2001 | Nakamura et al. | 117/84 |
| 2005/0018727 | A1 * | 1/2005 | Yoshida et al. | 372/44 |

FOREIGN PATENT DOCUMENTS

WO    WO-2005093915    10/2005

* cited by examiner

*Primary Examiner* — Bob M Kunemund
(74) *Attorney, Agent, or Firm* — Schwegman, Lundberg & Woessner, P.A.

(57) ABSTRACT

A laser has a laser material in thermal contact with a diamond, such that the diamond is operable to carry heat away from the laser material. In further embodiments, the diamond has a reduced nitrogen content, is a reduced carbon-13 content, is a monocrystalline or multilayer low-strain diamond, or has a thermal conductivity of greater than 2200 W/mK.

43 Claims, 2 Drawing Sheets

DIAMOND HEAT SINK IN A LASER

NOTICE OF RELATED AND COPENDING APPLICATIONS

This application is related to U.S. Pat. No. 6,582,513, which is hereby incorporated by reference, and is copending with multiple applications that are continuations thereof.

FIELD OF THE INVENTION

The invention relates generally to managing heat in lasers, and more specifically to a diamond heat sink in a laser.

BACKGROUND OF THE INVENTION

Lasers have found many uses since their introduction nearly fifty years ago, from the laser diode-based laser pointers available for under $20 to industrial high-power lasers such as are used in cutting and etching tools. All lasers share a few key characteristics—they employ a laser material and an energy source to pump or excite the laser material such that it generates or amplifies light. Light in this sense must be construed broadly, as modern lasers emit radiation ranging from x-ray to long infrared and microwave frequencies. Similarly, laser materials include a wide spectrum of materials, from solids such as ruby rods and solid state devices, to chemicals and gases.

Lasers typically rely upon exciting atoms or molecules within the laser material to an excited quantum energy state, such that electrons within the atoms jump from lower energy level orbits to higher energy level orbits. This process, known as pumping within the laser art, causes a population inversion within the laser material such that more atoms are in the excited quantum energy state than are in the original quantum energy state. Once the laser material is in a state of population inversion, light of a certain frequency passing through the laser material will be amplified as it passes through the laser material.

A significant characteristic of such lasers is that the light amplification in the laser material is coherent, such that the amplified light signal producecd is very nearly the same as the input light signal. This property enables production of the coherent beams of light commonly associated with lasers when the laser material is coupled with a feedback system such as mirrors to produce oscillation in the laser material. The resulting laser beam typically has a very narrow frequency and is very directional relative to other light sources, making lasers useful for a variety of purposes including surveying, cutting, and for optical data storage such as with Compact Discs or DVDs.

But, oscillating a light beam through a laser material often produces a great deal of heat that can damage the laser material, thereby limiting the power produced by various types of lasers. Scientists and engineers are seeking methods for producing higher power lasers for applications such as industrial tools, scientific research, and defense applications.

A laser having an enhanced ability to dissipate heat is therefore desired.

SUMMARY OF THE INVENTION

A laser has a laser material in thermal contact with a diamond, such that the diamond is operable to carry heat away from the laser material. In further embodiments, the diamond has a reduced nitrogen content, a reduced carbon-13 content, has a thermal conductivity of greater than 2200 W/mK, or is a monocrystalline or multilayer low-strain diamond.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the scope of the present invention. The following detailed description is, therefore, not to be taken in a limiting sense, and the scope of the invention is defined only by the appended claims.

The present invention provides cooling to the laser element of a laser assembly in various embodiments by use of a diamond heat sink or heat spreader. In one example embodiment, the laser material is in thermal and optical contact with a diamond heat sink such that the diamond is operable to carry heat away from the laser material. In further embodiments, the diamond has a reduced nitrogen content, a reduced carbon-13 content, or is a monocrystalline or multilayer low-strain diamond.

Figure 1:
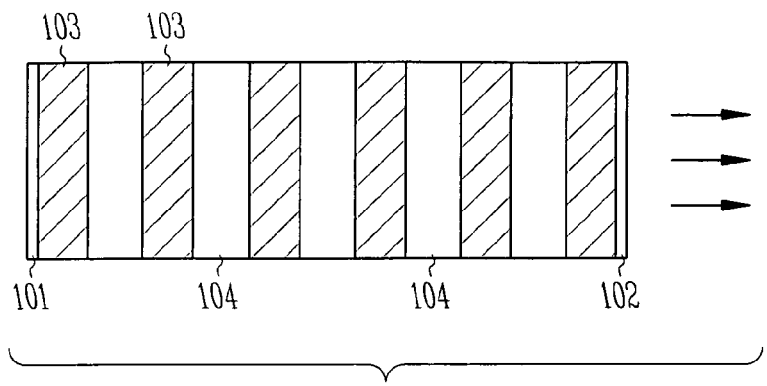
FIG. 1 shows an example laser assembly comprising multiple diamond heat sink elements, consistent with an example embodiment of the present invention.

FIG. 1 shows an example laser assembly comprising multiple diamond heat sink elements, consistent with an embodiment of the present invention. A reflective mirror 101 and a semireflective mirror 102 are positioned parallel to one another at each end of a rod section, shown in a side view in this diagram. The rod section comprises multiple laser element portions 103, and multiple diamond heat sink elements 104. The diamond heat sink elements are desirably optically transparent, and have optically flat surfaces that fit flush with optically flat surfaces of the laser elements 103. The laser elements in various embodiments may be any solid laser element, such as a ruby laser rod as was used in the first lasers or a chromium-doped sapphire rod.

As the laser material is pumped by an external light source, light oscillates between the mirror 101 and the semireflective mirror 102, and is amplified as it passes through the laser material. Because mirror 102 is semireflective, it passes a portion of the light striking it, resulting in a beam of laser light being emitted perpendicular to the mirror's semireflective plane. The pumping energy is not all converted to laser light—some of the energy is converted to heat. Further, as some laser materials change from an excited quantum energy state to a less energetic quantum energy state, a portion of the energy is dissipated as heat, such as through lattice phonon emission. Without the diamond heat sink elements 104, the laser material would be required to dissipate all heat energy released in the laser material into the surrounding medium, which is typically simply the surrounding air or water which have relatively poor thermal conductivity. The present invention seeks to more effectively remove heat from the laser material, using diamond in thermal contact with the laser material as is shown in the example of FIG. 1.

The laser material 103 and the diamond heat sink material 104 are in the embodiment shown polished to a high degree of flatness known as being optically flat, meaning that a surface is flat relative to a fraction of a wavelength of light of a specific frequency. This ensures minimal optical distortion or scatter, and also enables a thermally efficient junction to form between the elements by simply being configured in thermal or optical contact with one another. Heat transfer efficiency between laser elements 103 and diamond heat sink elements 104 decreases as the respective mating surfaces become rougher, resulting in less efficient cooling of the laser elements and possible distortion of the laser light as it traverses the laser assembly. Other methods of joining the laser material elements and diamond heat sink elements are appropriate, such as use of an adhesive that is optically transparent and has adequate thermal conductivity, and are within the scope of this invention.

Figure 2:
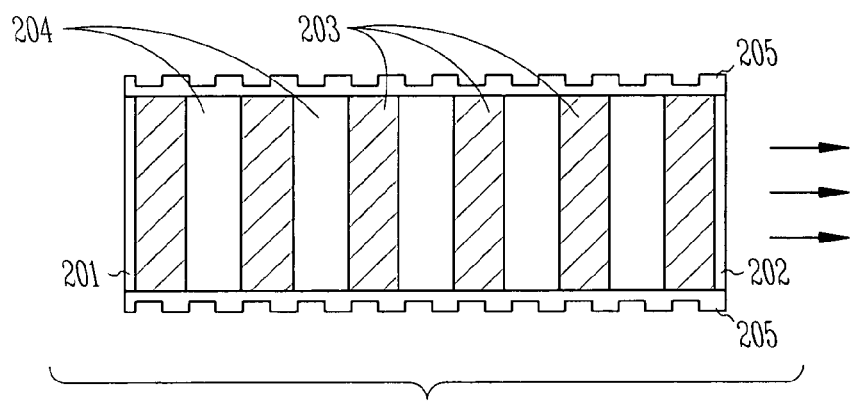
FIG. 2 shows the example laser assembly of FIG. 1 with additional diamond heat sink material, consistent with an example embodiment of the present invention.
Figure 3:
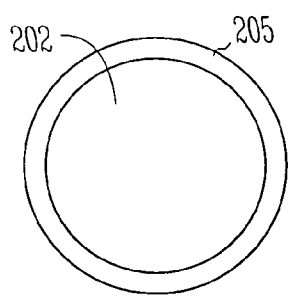
FIG. 3 shows an end view of the example laser assembly of FIG. 2, consistent with an example embodiment of the present invention.

FIG. 2 illustrates an enhancement to the laser assembly of FIG. 1, adding additional heat sink elements 205 external to the rod formed by the sandwich of laser material and diamond elements of FIG. 1. A reflective mirror 201 and a semireflective mirror 202 again bound a sandwich of laser elements 203 and diamond heat sink elements 204, and heat sink element 205 serves to further draw heat from both the laser elements 203 and the diamond heat sinks 204. The heat sink element 205 is may be diamond, but in other embodiments is another material having a greater thermal conductivity than air or than the surrounding environment. For example, FIG. 3 shows an end view of a laser material rod, such that the end of the rod's semireflective mirror 202 is surrounded by the heat sink material 205. The heat sink material 205 is in some embodiments a hollow cylinder, and in other embodiments is a radial fin attached to a cylindrical heat sink sleeve that slides over the laser rod assembly. In any event, the heat sink material 205 further carries heat away from the laser material, and serves as a thermal interface to the environment with a greater surface area than the laser material alone.

Figure 4:
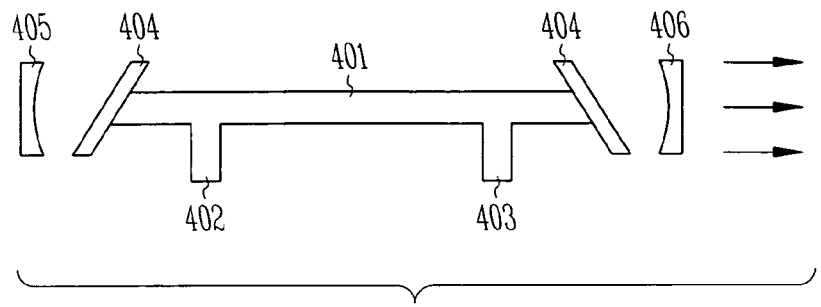
FIG. 4 shows a gas laser employing diamond heat sink material, consistent with an example embodiment of the present invention.

Diamond can also be used as a heat sink material in other types of lasers, such as the gas laser of FIG. 4. A chamber 401 contains a gas, such as Argon, which serves as the laser material. The tube is pumped or excited with application of electricity across electrodes 402 and 403, and Brewster-angle end windows 404, which transmit light of the proper polarization to mirror 405 and semireflective mirror 406. Because the laser of FIG. 4 is pumped electrically rather than optically, insertion of a disc of diamond into the chamber 401 in some locations is not practical, as it will block the electric current conducted between electrodes 402 and 403. Diamond can still be utilized in a location not between the electrodes, such as to form Brewster windows 404. In gas lasers pumped optically or by other methods, diamond elements can be placed throughout the chamber 401 to absorb heat and carry it away from the laser material. Similar application of a diamond heat sink can be made to the chamber of a chemical laser, as long as the diamond does not interfere with excitation of the laser material. It is anticipated that because heat dissipation is often not the limiting factor in power produced in chemical and gas lasers that diamond heat sinks will typically provide the greatest benefit to solid laser element laser assemblies.

Figure 5:
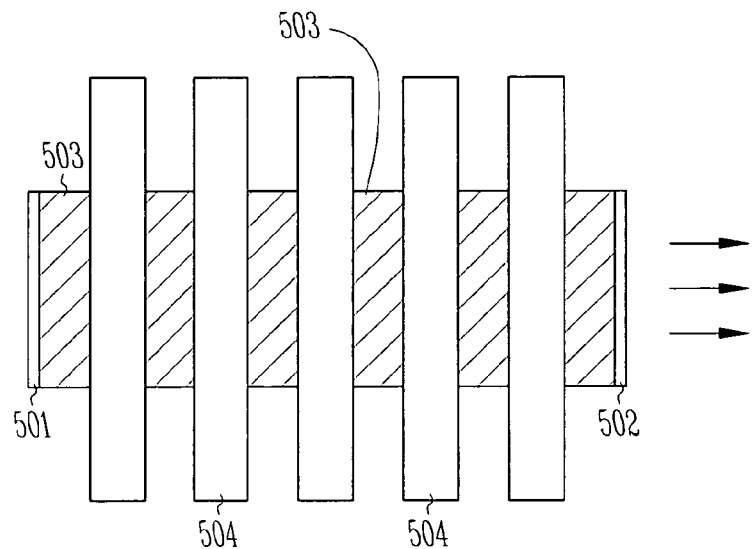
FIG. 5 shows an example laser assembly comprising multiple diamond heat sink elements larger in diameter than multiple laser material elements, consistent with an example embodiment of the present invention

FIG. 5 illustrates a solid laser material assembly using diamond as a heat sink, incorporating diamond heat sink elements of a diameter larger than the laser elements. The mirror 501 and semireflective mirror 502 contain a sandwich of laser material elements 503 and diamond heat sink elements 504 much like the diamond laser assembly of FIG. 1, but the diamond heat sink elements 504 are larger in diameter than the laser material elements 503. This provides a greater surface area interface between the diamond heat sink elements 504 and the surrounding environment, enabling greater heat transfer from the diamond to the environment.

In further embodiments, the heat sink elements 504 will have surfaces having a roughness or surface features designed to increase the surface area between the diamond heat sink and its environment, including features large in scale such as fins or pins extending from a solid portion of diamond located between the laser material elements.

The environment is almost certain to be a significantly poorer conductor of heat than diamond, although a high heat conductivity is desirable. Air, for example, has a thermal conductivity of only about 0.03 W/mK, and water has a thermal conductivity of about 0.6 W/mK (Watts per meter Kelvin), both of which pale in comparison to natural diamond's conductivity of around 2000 W/mK. Even metals generally considered to be good heat conductors are poor heat conductors relative to diamond, such as Copper at 390 W/mK, and aluminum at 236 W/mK. For these reasons, it is desirable to configure the diamond heat sink elements 504 such that their interface to their environment has a significant amount of interface surface area.

As illustrated by the laser examples given above, lasers can be assembled with a variety of laser materials and utilizing a variety of pumping methods. Although diamond heat sinks are believed to be particularly applicable to solid laser materials pumped with optical energy or other energy that is conducted through diamond, examples such as that of FIG. 4 show how they can be used with gas or chemical lasers pumped through other means.

Lasers are pumped in a variety of ways in addition to gas discharge and optical pumping illustrated in the previous examples. Chemical reactions can be employed in chemical mixing, flash photolysis, and direct laser action in flame to pump a laser material. Such methods are desirable for high power continuous output laser systems due to the amount of energy released in such reactions. Hundreds of kilowatts or more can be sustained in such reactions, making such lasers among the most powerful available.

Direct electrical pumping, such as high-voltage electron injection into gas-filled chambers or direct current injection into semiconductor lasers is also used to excite laser material into a suitable quantum energy state. Gas laser tube can be similarly excited by nuclear pumping, such as by fission byproducts or other nuclear radiation. Supersonic expansion of gases, including gases preheated by electrical discharge or chemical reaction, can also excite gas to a laser quantum energy level, in laser systems known as gasdynamic lasers. Still other methods such as X-ray pumping, plasma pumping in hot dense plasma, and other technologies are known to exist or are the subject of research, and will benefit from employing embodiments of the present invention.

Figure 6:
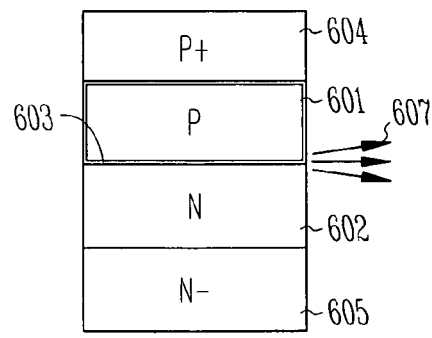
FIG. 6 shows a semiconductor laser cooled by diamond heat sink material, consistent with an example embodiment of the present invetntion.

FIG. 6 shows one type of semiconductor laser employing a diamond heat sink. A p-type material 601 and an n-type material 602 are joined to create a junction which becomes an active region 603. In some embodiments, a heterostructure is formed by adding a second p-type material 604 with a wider bandgap than p-type material 601, and by adding a second n-type material 605 having a wider bandgap than n-type material 602. Upon application of sufficient forward-biased current, the p-n junction active region 603 is injected with electrons from the n-region 602 and holes from the p-region 601. When both holes and electrons occupy the active region, they are susceptible to joining, resulting in emission of a photon. This principle drives light output from semiconductor lasers as well as from light emitting diodes. In the semiconductor laser diode of FIG. 6, combination of a hole and electron stimulated by a photon results in emission of another photon of the same frequency, direction, phase, and polarization as the stimulating photon. If the photons are reflected through the active region, it is able to serve as a laser material, and emits a coherent beam of light 607 from its edge.

Because diamond can be doped with boron to produce p-type semiconductor material and can be doped with phosphorous to create n-type semiconductor material, a single junction diode laser or heterojunction diode laser can be formed with laser as a semiconductor material. Examples include use of p-type diamond for p-type material 604 and n-type diamond for n-type material 605. Use of doped diamond as p-type material 601 and n-type material 602 will result in a diamond active region 607 at the interface between p-type material 601 and n-type material 602. Other embodiments employ diamond as a substrate upon which a semiconductor laser such as that shown in FIG. 6 is formed, enabling the diamond to carry heat away from the semiconductor laser. A variety of other semiconductor laser configurations can be similarly cooled by application of diamond heat sink material, such as vertical cavity surface emitting lasers and distributed feedback semiconductor lasers, and are within the scope of the present invention.

Various embodiments of the present invention incorporate novel types of diamond, including CVD (chemical vapor deposition) synthetic diamond grown under processes designed to encourage fast growth or high thermal conductivity. Examples of such are given in the related copending U.S. Patent "System and Method for Producing Synthetic Diamond", U.S. Pat. No. 6,582,513, which is hereby incorporated by reference.

Specific examples of diamonds particularly well-suited for use include those having particularly high thermal conductivity. For example, diamonds having a greater than average purity of carbon-12 and a corresponding reduced concentration of carbon-13 are known to be particularly thermally conductive, but are relatively expensive to produce due to the difficulty in producing carbon that doesn't have the natural concentration of approximately 1.1% carbon-13. Synthetic diamonds that are known as isotopically enriched diamonds contain more than a typical or natural amount of certain isotopes, such as isotpoically enhanced carbon-12 containing more than a typical amount of carbon-12, making it particularly desirable for producing high thermal conductivity diamonds. Isotopic enrichment of the diamond CVD precursor gases with carbon-12 can result in a diamond with conduction as hih as 3300 W/mK, but requires that carbon-13 concentrations be reduced to approximately 0.0001%. Unfortunately, the cost of producing isotpoically enriched carbon-12 CVD diamond precursors such as methane is approximately 100 times the cost of producing the same materials with a more typical distribution of carbon isotopes. Other CVD methods can be utilized with precursor gases having a typical distribution of carbon isotopes at a much lower cost, resulting in diamonds having conductivity of 2800 W/mK or higher.

Several examples of less expensive methods of creating diamonds with enhanced thermal conductivity are disclosed in the referenced Patent and are within the scope of the present invention, including growing synthetic diamond low in nitrogen, growing synthetic diamond in an environment rich in hydrogen, or growing diamond doped with boron. Reduction in nitrogen impurities in the diamond can be utilized with precursor gases having a typical distribution of carbon isotopes at a much lower cost than isotopically enriched precursor materials, resulting in diamonds having conductivity of 2800 W/mK or higher. The thermal conductivity will be partly dependent on how much nitrogen remains present in the diamond—it is desired to reduce the nitrogen concentration as low as is economically practical, such as less than 5 ppm (parts per million), but thermal conductivity will still be improved with reduction in nitrogen concentration to higher reduced concentrations such as 50 ppm.

Other types of synthetic diamond, such as boron-doped diamond, will have properties that make them particularly suited for some applications. Boron-doped diamond, for example, is blue in color so may not be an ideal choice of heat sink material for a laser radiating energy in a color absorbed within the blue diamond. But, boron-doped diamond is significantly higher in electrical conductivity than natural diamond, making it desirable where electrical or electromagnetic pumping of the laser material is a goal or in other circumstances where electrical conduction is desirable. One example is a semiconductor laser having a blue wavelength or other wavelength able to pass through the boron-doped diamond, as are used in the communications industry and for applications such as reading high-density optical disks similar to DVDs. The optical properties of the diamond are less significant if it is used in a way that enables it to conduct heat away from the laser material while not blocking the laser beam itself, such as in an end mirror assembly as is shown in FIG. 4, or as a substrate material for a semiconductor diamond. Because boron-doped diamond acts as a p-type semiconductor and phosphorous-doped diamond acts as an n-type semiconductor, semiconductor lasers can be fabricated from diamond materials and withstand higher powers than typical semiconductor lasers of the same size.

Diamond heat sink elements of sufficient size are formed in one embodiment by a tiling process involving implanting a layer of hydrogen into a diamond before or during the synthetic diamond growth process, and by subsequently applying heat to separate the grown diamond at the hydrogen implant layer. Such a process also enables production of multiple tiles of diamond having a similar composition and crystal structure, and may be tiled together to produce larger seed diamonds to produce relatively large grown synthetic diamond. It is further anticipated that the highly included, high carbon density, or boron-doped diamond's characteristic hardness will make then well-suited for formation of relatively hard diamond grit, and will have particular value as a polishing agent for producing optically flat diamond heat sink elements.

The examples of laser assemblies employing diamond materials near the laser material to act as a heat sink given here are but a few examples of how various types of diamond may be employed in laser assembly configurations consistent with the present invention. A variety of other laser assemblies will benefit from employing diamond heat sink material near the laser material, and are within the scope of the present invention. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

The invention claimed is:

1. A laser assembly, comprising:
   a laser material comprising at least one of a non-semiconducting solid, a gas, a chemical or other non-semiconductor laser material;
   a diamond in contact with the laser material, the diamond operable to transfer heat from the laser material, wherein the diamond has a thermal conductivity of greater than 2200 W/mK.

2. The laser assembly of claim 1, wherein the diamond is a synthetic monocrystalline diamond.

3. The laser assembly of claim 1, wherein the diamond comprises less than 1 ppm impurities.

4. The laser assembly of claim 1, wherein the diamond has a thermal conductivity of greater than 2500 W/mK.

5. The laser assembly of claim 1, wherein the diamond has a thermal conductivity of greater than 2700 W/mK.

6. The laser assembly of claim 1, wherein the diamond has a thermal conductivity of greater than 3200 W/mK.

7. The laser assembly of claim 1, wherein the diamond is isotopically enhanced with carbon-12 such that the resulting carbon-13 concentration is less than 1%.

8. The laser assembly of claim 1, wherein the diamond is isotopically enhanced with carbon-12 such that the resulting carbon-13 concentration is less than 0.1%.

9. The laser assembly of claim 1, wherein the diamond is isotopically enhanced with carbon-12 such that the resulting carbon-13 concentration is less than 0.001%.

10. The laser assembly of claim 1, wherein the diamond is has a nitrogen concentration of less than 50 ppm.

11. The laser assembly of claim 1, wherein the diamond is has a nitrogen concentration of less than 10 ppm.

12. The laser assembly of claim 1, wherein the diamond is has a nitrogen concentration of less than 5 ppm.

13. The laser assembly of claim 1, wherein the diamond is a low-strain multilayer monocrystalline CVD diamond, wherein the multiple layers of the multilayer diamond comprise different atomic composition.

14. A method of constructing a laser assembly, comprising:
    configuring a diamond in contact with a laser material, the diamond operable to transfer heat from the laser material, the laser material comprising at least one of a non-semiconducting solid, a gas, a chemical or other non-semiconductor laser material.

15. The method of constructing a laser assembly of claim 14, wherein the diamond is a synthetic monocrystalline diamond.

16. The method of constructing a laser assembly of claim 14, wherein the diamond comprises less than 1 ppm of impurities.

17. The method of constructing a laser assembly of claim 14, wherein the diamond has a thermal conductivity of greater than 2500 W/mK.

18. The method of constructing a laser assembly of claim 14, wherein the diamond has a thermal conductivity of greater than 2700 W/mK.

19. The method of constructing a laser assembly of claim 14, wherein the diamond has a thermal conductivity of greater than 3200 W/mK.

20. The method of constructing a laser assembly of claim 14, wherein the diamond is isotopically enhanced with carbon-12 such that the resulting carbon-13 concentration is less than 1%.

21. The method of constructing a laser assembly of claim 14, wherein the diamond is isotopically enhanced with carbon-12 such that the resulting carbon-13 concentration is less than 0.1%.

22. The method of constructing a laser assembly of claim 14, wherein the diamond is isotopically enhanced with carbon-12 such that the resulting carbon-13 concentration is less than 0.001%.

23. The method of constructing a laser assembly of claim 14, wherein the diamond is has a nitrogen concentration of less than 50 ppm.

24. The method of constructing a laser assembly of claim 14, wherein the diamond is has a nitrogen concentration of less than 10 ppm.

25. The method of constructing a laser assembly of claim 14, wherein the diamond is has a nitrogen concentration of less than 5 ppm.

26. The method of constructing a laser assembly of claim 14, wherein the diamond is a low-strain multilayer monocrystalline CVD diamond, wherein the multiple layers of the multilayer diamond comprise different atomic composition.

27. A method of constructing a semiconductor laser, comprising:
    forming an n-type semiconductor in contact with a p-type semiconductor to form a semiconductor p-n junction having a laser active region at the junction; and
    coupling at least one layer of diamond to the n-type semiconductor, the p-type semiconductor, or the p-n junction, wherein the diamond has a thermal conductivity of greater than 2200 W/mK;
    wherein the at least one layer of diamond comprises at least one of the p-type material used to form the p-n junction or the n-type material used to form the p-n junction.

28. The semiconductor laser of claim 27, wherein the at least one layer of diamond is a substrate on which the semiconductor p-n junction is constructed.

29. A method of operating a laser assembly comprising:
    carrying heat away from a laser material via a diamond in thermal contact with the laser material, wherein the diamond has a thermal conductivity of greater than 2200 W/mK, and wherein the laser material comprises at least one of a non-semiconducting solid, a gas, a chemical or other non-semiconductor laser material.

30. The method of operating a laser assembly of claim 29, wherein the diamond is a synthetic monocrystalline diamond.

31. The method of operating a laser assembly of claim 29, wherein the diamond comprises impurities of less than 1 ppm.

32. The method of operating a laser assembly of claim 29, wherein the diamond has a thermal conductivity of greater than 2500 W/mK.

33. The method of operating a laser assembly of claim 29, wherein the diamond has a thermal conductivity of greater than 2700 W/mK.

34. The method of operating a laser assembly of claim 29, wherein the diamond has a thermal conductivity of greater than 3200 W/mK.

35. The method of operating a laser assembly of claim 29, wherein the diamond is isotopically enhanced with carbon-12 such that the resulting carbon-13 concentration is less than 1%.

36. The method of operating a laser assembly of claim 29, wherein the diamond is isotopically enhanced with carbon-12 such that the resulting carbon-13 concentration is less than 0.1%.

37. The method of operating a laser assembly of claim 29, wherein the diamond is isotopically enhanced with carbon-12 such that the resulting carbon-13 concentration is less than 0.001%.

38. The method of operating a laser assembly of claim 29, wherein the diamond is has a nitrogen concentration of less than 50 ppm.

39. The method of operating a laser assembly of claim 29, wherein the diamond is has a nitrogen concentration of less than 10 ppm.

40. The method of operating a laser assembly of claim 29, wherein the diamond is has a nitrogen concentration of less than 5 ppm.

41. The method of operating a laser assembly of claim 29, wherein the diamond is a low-strain multilayer monocrystalline CVD diamond, wherein the multiple layers of the multilayer diamond comprise different atomic composition.

42. A method of operating a semiconductor laser, comprising:
cooling a laser active region of a semiconductor p-n junction with at least one layer of diamond coupled to the p-n junction or the laser active region, wherein the diamond has a thermal conductivity of greater than 2200 W/mK, wherein the at least one layer of diamond comprises at least one p-type material used to form the p-n junction, n-type material used to form the p-n junction, and the laser active region.

43. The method of operating a semiconductor laser of claim 42, wherein the at least one layer of diamond is a substrate on which the semiconductor p-n junction and active region are constructed.

* * * * *